United States Patent
Moran et al.

[19]

[11] Patent Number: 5,844,784
[45] Date of Patent: Dec. 1, 1998

[54] BRACE APPARATUS AND METHOD FOR PRINTED WIRING BOARD ASSEMBLY

[75] Inventors: Sean A. Moran; Jose F. Olivas; Thomas J. Chintala, all of San Diego, Calif.

[73] Assignee: Qualcomm Incorporated, San Diego, Calif.

[21] Appl. No.: 823,774

[22] Filed: Mar. 24, 1997

[51] Int. Cl.$^6$ .................................................... H05K 9/00
[52] U.S. Cl. ........................ 361/818; 361/800; 174/35 R
[58] Field of Search .................... 361/800, 816, 361/818, 796, 748; 174/35 R, 35 GC, 50

[56] References Cited

U.S. PATENT DOCUMENTS

| | | | |
|---|---|---|---|
| 4,370,515 | 1/1983 | Donaldson | 361/818 X |
| 5,495,399 | 2/1996 | Gore et al. | 361/814 |
| 5,559,676 | 9/1996 | Gessaman | 361/752 |

*Primary Examiner*—Leo P. Picard
*Assistant Examiner*—Jayprakash N. Gandhi
*Attorney, Agent, or Firm*—Russell B. Miller; Charles D. Brown

[57] ABSTRACT

A combined EMI shield and brace assembly has at least two frames for placing side-by-side on a printed wiring board to surround predetermined adjacent areas on the board containing components to be shielded from one another, and a brace member securing the two frames together during reflow. Each frame has a peripheral side wall forming an enclosed area of predetermined shape and dimensions and a portion of the side wall of one frame is placed against a portion of the side wall of the other frame so that the two frames together form an enlarged enclosed area divided into two sub-areas by the adjacent side wall portions extending across the enlarged area. The brace member extends over the frames and is secured to their side walls, and may secure two or more frames together.

7 Claims, 1 Drawing Sheet

BRACE APPARATUS AND METHOD FOR PRINTED WIRING BOARD ASSEMBLY

CROSS REFERENCE TO RELATED APPLICATIONS

This application is related to a co-pending application entitled "EMI Shield Apparatus for Printed Wiring Board" of the same inventors, which was filed on even date herewith.

BACKGROUND OF THE INVENTION

I. Field of the Invention

The present invention relates generally to the assembly of printed wiring boards, and is particularly concerned with the placement and attachment of EMI (electromagnetic interference) shields on such boards.

II. Description of the Related Art

EMI shields are typically rectangular frames with integral or separate covers which are placed at appropriate positions on printed wiring boards during their construction in order to shield various components from each other, to reduce or eliminate noise or interference between components. Typically, dots of solder are placed at appropriate locations on the board surrounding components to be shielded, and the EMI shields are placed onto the lines of solder dots or pads, normally using an optical pick-and-place machine. The board then passes through a reflow oven to soften the solder so that it adheres to the shields and other components. When the shields pass through the reflow oven, they often skew from their original alignment as they settle into the reflowed solder pads. This can cause RF leakage when EMI shields are abutted against each other and therefore must maintain their relative alignment.

SUMMARY OF THE INVENTION

It is an object of the present invention to provide a new and improved brace apparatus for steadying EMI shields on printed wiring boards during assembly.

According to one aspect of the present invention, a combined EMI shield and brace assembly comprises at least two frames for placing side-by-side on a printed wiring board to surround predetermined areas on the board containing components to be shielded from one another, each frame having a peripheral side wall forming an enclosed area of predetermined shape and dimensions and a portion of the side wall of one frame being placed against a portion of the side wall of the other frame so that the two frames together form an enlarged enclosed area divided into two sub-areas by the adjacent side wall portions extending across the enlarged area, and a brace member securing the two frames together.

In a preferred embodiment of the invention, the brace member comprises a cover of shape and dimensions corresponding to the combined area of the frames, the cover having a peripheral side wall for engagement over the side walls of the frames enclosing the enlarged enclosed area. The brace member will therefore tend to hold the frames together during reflow, so that they cannot skew or shift relative to one another out of their preferred alignment as they settle into the softened solder pads.

The frames, which form EMI shields, are generally of rectangular or polygonal shape and are placed side-by-side with adjacent straight side wall portions in face-to-face engagement to form a cross wall between adjacent, shielded areas of the board. In practice, two, three or more such shields may be placed side-by-side on a printed wiring board, and the brace member will be of appropriate shape and dimensions to extend over the entire area encompassed by all of the shields or frames.

The side walls of the frames and the side walls of the brace member preferably have interengageable formations for releasably securing the brace member to the frames during reflow. Preferably, the outer surfaces of the frame side walls have a series of depressions or dimples, and the inner surfaces of the brace member side walls have corresponding spaced bumps or protrusions for snap engagement into the depressions or dimples. In one embodiment of the invention, each frame has an integral top wall or cover, and the brace member is releasably secured over the frames and removed after reflow and solidification of the solder pads is complete. In another embodiment, the frames are open and the brace member is left in place after reflow, forming the top cover for all of the frames. In this case, the brace member actually forms part of the final EMI shield on the printed wiring board.

According to another aspect of the present invention, a method of steadying EMI shields during reflow is provided, which comprises the steps of placing at least two frames each having a side wall encompassing a predetermined area at predetermined, side-by-side locations on a printed wiring board with a portion of the side wall of each frame engaging a portion of the side wall of the other frame, securing the two frames together with a brace, and moving the printed wiring board through a reflow oven to soften solder pads on which the frames rest to adhere the frames at the predetermined locations on the board, with the brace being removed after reflow or left in place, depending on whether or not the frames have a top wall.

With this invention, proper relative alignment of EMI shields can be maintained during IR or hot air solder reflow processing. This avoids or reduces the risk of EMI shields skewing from their proper orientation as they settle into reflowed solder pads.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
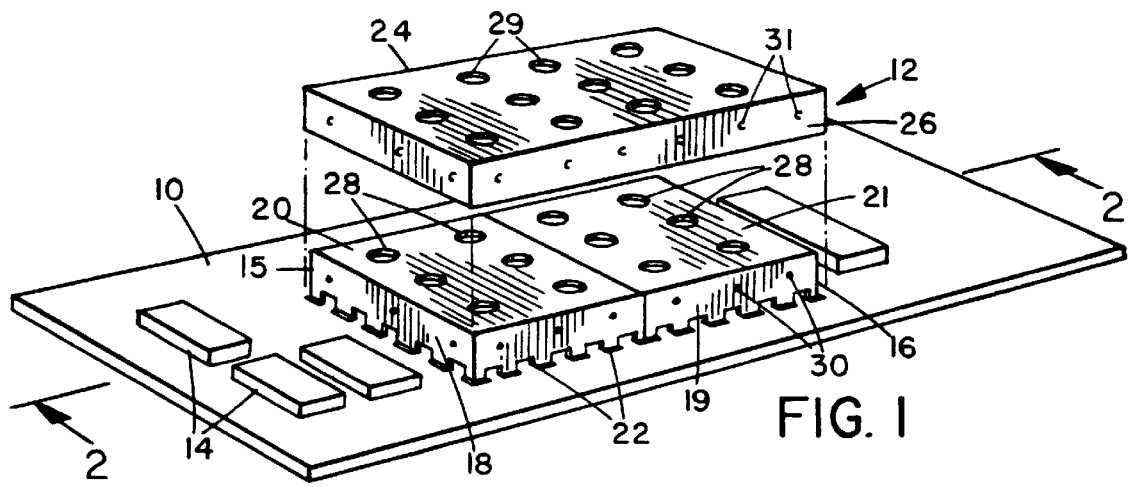
FIG. 1 is a perspective view of a printed wiring board with a combined EMI shield and brace assembly according to a first embodiment of the present invention.
Figure 2:
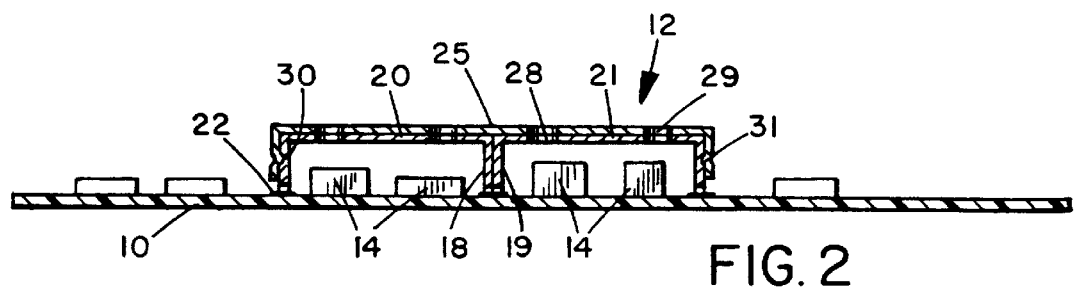
FIG. 2 is a cross-section on the lines 2—2 of FIG. 1.

FIGS. 1 and 2 of the drawings illustrate a printed wiring board 10 with a combined EMI shield and brace assembly 12 according to a first embodiment of the present invention. Printed wiring boards 10 have a plurality of different electronic components 14 attached to their surfaces. EMI shields are typically secured at selected positions on such boards in order to shield components from each other and thus reduce noise or interference and increase circuit performance.

Two one-piece EMI shields 15,16 are illustrated in FIG. 1, although it will be understood by those skilled in the field that more EMI shields will normally be used. Each EMI shield comprises a rectangular frame having four perpendicular side walls 18, 19, respectively, and a top wall or cover 20, 21, respectively, extending across the top of the frame. It will be understood that frames of different sizes and shapes may be used, depending on the component layout and the board area to be surrounded by each frame. The two shields 15,16 illustrated in FIGS. 1 and 2 are positioned to shield two adjacent rectangular areas on the frame, with one side wall 18, 19 of each frame in face-to-face engagement with an adjacent side wall of the other frame to form a cross wall between the adjacent enclosed areas of the board. In practice, the shields 15 and 16 are positioned on the board in a conventional manner, using an optical pick-and-place machine, so that the lower edges of the frame rest on spaced solder pads 22 deposited on the board to provide attachment points for the EMI shields.

Once two or more EMI shields have been positioned on the board as illustrated in FIG. 1, a brace member 24 is placed over the shields to secure them together. Brace member 24 comprises a rectangular cover 25 of shape and dimensions corresponding to the combined shape and dimensions of the two EMI shields, and has a downwardly projecting peripheral rim or side wall 26 for engagement over the side walls 18 of the two EMI shields, as best illustrated in FIG. 2. The one-piece EMI shields of FIGS. 1 and 2 have openings 28 in top wall 20 for heat flow during reflow, and the brace member 24 is provided with corresponding openings 29 in cover 25. The outer side walls 18 of the EMI shields are provided with spaced dimples or indents 30, while the inner faces of side walls 26 of the brace member are provided with corresponding bumps or protrusions for snap engagement in indents 30, as best illustrated in FIG. 2. It will be understood that other alternative formations may be provided for mating engagement between the EMI shields and brace member, for example the side walls of the shield may have bumps or protrusions, while the brace member side walls has indents or dimples, or slots for engagement over ribs in the shield side walls.

When the brace member has been secured over two or more EMI shields as illustrated in FIG. 2, the assembly is passed through a reflow oven so that the solder pads 22 are softened to adhere to shields 15, 16. The brace member 24 will hold the shields in position so that they cannot skew relative to one another as they settle into the reflowed solder pads. After reflow, the assembly is cooled to harden the solder pads, attaching the EMI shields to the board. After the solder pads have hardened, brace member 24 is removed. As best illustrated in FIG. 2, the brace side walls are shorter than the frame side walls, so that the brace member is raised above the solder pads and does not adhere to them.

Although the brace member is a rectangular lid-shaped device with a continuous peripheral rim or side wall in the illustrated embodiment, it will be understood that alternative brace devices may be used, such as a single web spanning the EMI shields from one end to another across the adjacent side walls forming the cross wall at the junction between the shields, with a lip at each end for releasably attachment to the side walls at the respective ends. The web could be relatively narrow and would not need to cover the entire upper faces of the shields. Additionally, the brace member may be of different shapes for spanning different arrangements of two or more EMI shields, either shaped to match the entire area covered by the shields, or to extend over all the shields across their mating faces or side walls.

Figure 3:
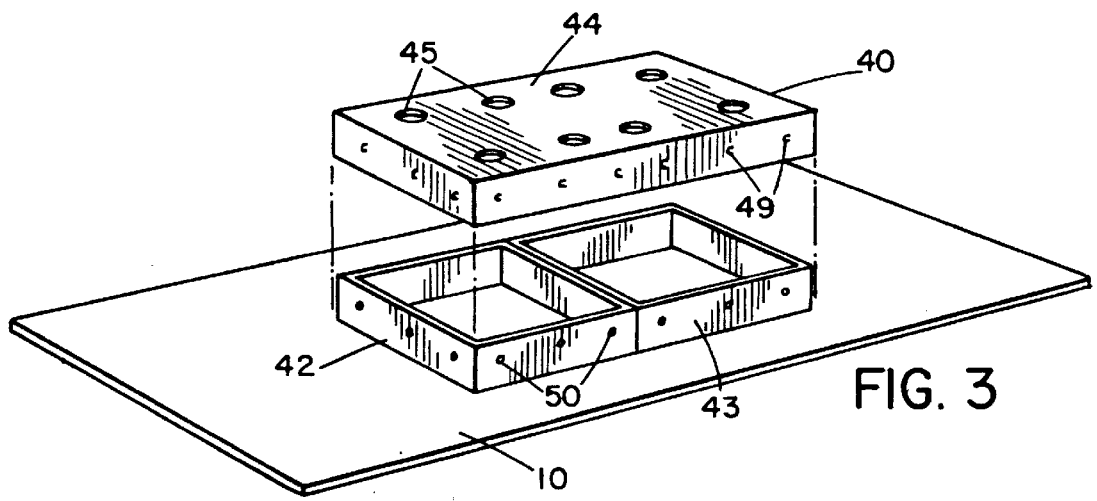
FIG. 3 is a perspective view similar to FIG. 1 illustrating an alternative configuration of the assembly.

In the embodiment of FIGS. 1 and 2, the brace member is used in conjunction with one-piece EMI shields which each have a frame and an integral top cover or wall. In the embodiment of FIG. 3, brace member 40 replaces the top covers of two, two-part EMI shields. A two part EMI shield generally comprises an open frame of preselected shape and dimensions, and a removable lid or cover (not illustrated) for engagement over the frame. The advantage of a two part EMI shield over a one piece shield is that if a component under the shield is faulty, the entire shield does not have to be removed for maintenance purposes. Instead, the removable cover is simply taken off, exposing the contained components for testing and replacement if necessary. With the brace assembly of this invention, the existing removable covers which would each cover one of the two open frames 42, 43 are left off, and replaced with a single brace member 40 for covering both frames 42 and 43, and securing them together. Clearly, if three or more EMI shield frames were used on the board, the brace member 40 would simply be enlarged to cover all of the frames.

In this embodiment, as in the previous embodiment, the brace member 40 has a cover or top wall 44 with openings 45 for heat dispersion during reflow, and a downwardly depending rim or side wall 46 for engagement over the outer side walls of the two frames 42, 43 to be placed on printed wiring board 10. As in the previous embodiment, the side wall has protrusions 49 for snap engagement in recesses or dimples 50 in the side walls of the EMI shield frames. Unlike the previous embodiment, the brace member 40 will be secured over the frames prior to placement on board 10, so that it provides a surface for attachment to the suction head of the optical pick-and-place machine as the EMI shields are appropriately positioned on the board. After positioning the shields and brace member on the board, the board is moved through a reflow oven to soften the solder pads and adhere the frames to the board. The brace member will prevent the frames from moving relative to one another during reflow, maintaining them in the desired relative positions on the board. The brace member is not removed after reflow in this case, but remains attached to the frames to provide a top cover for the areas enclosed by the frames.

In each of the above embodiments, the brace member avoids relative movement between two or more EMI shields during reflow, by bracing or securing the shields together during reflow. The brace member may be removed after reflow, or may be left in place where the EMI shields are simply, open frames and the brace itself then forms the top wall of each of the shields. This invention therefore helps to ensure proper relative alignment of EMI shields during IR or hot air solder reflow processes.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A combined EMI shield and brace assembly, comprising:

at least two frames for placing side-by-side on a printed wiring board to surround predetermined areas on the board containing components to be shielded from one another, each frame having a peripheral side wall forming an enclosed area of predetermined shape and dimensions and a portion of the side wall of one frame being movably placed against a portion of the side wall of the other frame so that the two frames together form an enlarged enclosed area divided into two sub-areas by the adjacent side wall portions forming a cross wall extending across the enlarged area; and a brace member covering and securing the two frames together said brace member preventing said at least two frames from skewing relative to each other.

2. The assembly as claimed in claim 1, wherein a plurality of frames are placed side-by-side and the brace member secures all the frames together.

3. The assembly as claimed in claim 1, wherein the brace member comprises a cover of shape and dimensions corresponding to the combined area of the frames, the cover having a peripheral side wall for engagement over the side walls of the frames enclosing the enlarged enclosed area.

4. The assembly as claimed in claim 3, wherein the frame side walls have outer faces with spaced first formations, and the brace member side walls have inner faces with spaced second formations for mating engagement with said first formations for releasably securing the brace member to the frames.

5. The assembly as claimed in claim 1, wherein each frame has an integral top wall extending across the frame, and the brace member is releasably secured over the frames.

6. The assembly as claimed in claim 1, wherein the frames are open and the brace member is secured to the frames to form a top wall of each of the frames.

7. A combined EMI shield and brace assembly, comprising:

at least two frames for securing side-by-side on a printed wiring board to enclose predetermined adjacent areas on the board to shield components in one enclosed area from components in the adjacent enclosed area, each frame having one side wall placed in face-to-face movable engagement with an opposing side wall of the other frame to form a cross wall separating the enclosed areas; and a brace member extending transversely across the cross wall and the two frames, the brace member having securing means for releasably securing the brace member to each of the frames to hold the opposing side walls together during reflow.

\* \* \* \* \*